United States Patent
Ding et al.

(10) Patent No.: US 12,324,357 B2
(45) Date of Patent: Jun. 3, 2025

(54) VOLTAGE-CONTROLLED THREE-TERMINAL MAGNON TRANSISTOR, AND CONTROL AND PREPARATION METHOD THEREOF

(71) Applicant: Nanjing University, Nanjing (CN)

(72) Inventors: Haifeng Ding, Nanjing (CN); Bingfeng Miao, Nanjing (CN); Jun Cheng, Nanjing (CN); Rui Yu, Nanjing (CN); Liang Sun, Nanjing (CN)

(73) Assignee: Nanjing University, Nanjing (CN)

( * ) Notice: Subject to any disclaimer, the term of this patent is extended or adjusted under 35 U.S.C. 154(b) by 0 days.

(21) Appl. No.: 18/837,220

(22) PCT Filed: Nov. 7, 2023

(86) PCT No.: PCT/CN2023/130196
§ 371 (c)(1),
(2) Date: Aug. 9, 2024

(87) PCT Pub. No.: WO2025/076896
PCT Pub. Date: Apr. 17, 2025

(65) Prior Publication Data
US 2025/0127062 A1    Apr. 17, 2025

(30) Foreign Application Priority Data
Oct. 13, 2023   (CN) .......................... 202311326693.9

(51) Int. Cl.
*H10N 50/20*   (2023.01)
*H10N 50/85*   (2023.01)

(52) U.S. Cl.
CPC ............. *H10N 50/20* (2023.02); *H10N 50/85* (2023.02)

(58) Field of Classification Search
CPC ................................ H10N 50/20; H10N 50/85
(Continued)

(56) References Cited

U.S. PATENT DOCUMENTS 6,285,577 B1 * 9/2001 Nakamura .......... G11C 11/5657
365/65
7,764,136 B2 * 7/2010 Suzuki ................. H03B 15/006
257/421
(Continued)

FOREIGN PATENT DOCUMENTS

CN   107910436 A   4/2018
CN   108123028 A   6/2018
(Continued)

OTHER PUBLICATIONS

L. J. Cornelissen, et al., Spin-Current-Controlled Modulation of the Magnon Spin Conductance in a Three-Terminal Magnon Transistor, Physical Review Letters, 2018, pp. 097702-1-097702-6, vol. 120.
(Continued)

*Primary Examiner* — Jami Valentine Miller
(74) *Attorney, Agent, or Firm* — Bayramoglu Law Offices LLC

(57) ABSTRACT

A voltage-controlled three-terminal magnon transistor is provided, including a ferroelectric layer, a magnetic layer, a generation terminal, a control terminal, a detection terminal, and a bottom electrode. After a current is inputted into the generation terminal, a magnon is generated in the magnetic layer. The detection terminal is made of a heavy metal material, which can convert the magnon in the magnetic layer into a charge flow. When a voltage pulse applied between the control terminal and the bottom electrode exceeds a critical value, non-volatile polarization and non-volatile strain states of the ferroelectric layer change, which in turn affects a transmission capability of the magnon in the magnetic layer based on a magnetoelectric coupling effect between the ferroelectric layer and the magnetic layer. In addition, a voltage signal of the detection terminal exhibits
(Continued)

a regular loop change behavior with a change of the voltage pulse.

20 Claims, 3 Drawing Sheets

(58) Field of Classification Search
USPC .......................................................... 257/421
See application file for complete search history.

(56) References Cited

U.S. PATENT DOCUMENTS

| | | | |
|---|---|---|---|
| 10,090,036 B2 * | 10/2018 | Van Houdt | H10D 64/033 |
| 10,991,874 B2 * | 4/2021 | Tan | H10N 59/00 |
| 2002/0012264 A1 * | 1/2002 | Ishiwara | G11C 11/22 |
| | | | 365/145 |

FOREIGN PATENT DOCUMENTS

| | | | |
|---|---|---|---|
| CN | 115244721 A | 10/2022 | |
| JP | 2018014498 A | 1/2018 | |

OTHER PUBLICATIONS

Andrii V. Chumak, et al., Magnon transistor for all-magnon data processing, Nature Communications, 2014, pp. 1-8, 5:4700.
K. S. Das, et al., Modulation of magnon spin transport in a magnetic gate transistor, Physical Review B, 2020, pp. 054436-1-054436-5, vol. 101.
Guangyi Chen, et al., Electrically switchable van der Waals magnon valves, Nature Communications, 2021, pp. 1-5, 12:6279.

* cited by examiner

VOLTAGE-CONTROLLED THREE-TERMINAL MAGNON TRANSISTOR, AND CONTROL AND PREPARATION METHOD THEREOF

CROSS REFERENCE TO THE RELATED APPLICATIONS

This application is the national phase entry of International Application No. PCT/CN2023/130196, filed on Nov. 7, 2023, which is based upon and claims priority to Chinese Patent Application No. 202311326693.9, filed on Oct. 13, 2023, the entire contents of which are incorporated herein by reference.

TECHNICAL FIELD

The present disclosure relates to the field of microelectronic information devices, and specifically, to a voltage-controlled three-terminal magnon transistor and a control and preparation method thereof.

BACKGROUND

The invention of the transistor is a milestone in the development of modern electronic technologies. Since the 1960s, the density of transistors in an integrated circuit has followed Moore's Law, and is doubled approximately every two years. However, as the integration density and operating speed increase, electronic devices are facing a serious power consumption problem, which clearly limits the development of integrated circuits in the future. Therefore, further development of transistors cannot rely solely on a charge property of an electron, but also requires finding an alternative solution. Collectively excited by a magnetic moment, a magnon can carry spin information without a need for charge motion. This process does not involve additional Joule heat. Therefore, the magnon becomes a highly anticipated information carrier in the post-Moore era. In consideration of a current obstacle faced by the transistor, it is crucial to design and manufacture a low-power magnon transistor.

As shown in FIGS. 1A-1B, a three-terminal magnon transistor is generally constituted by four parts: a magnon generation terminal 1 (S), a control terminal 2 (G), a detection terminal 3 (D), and a magnon transmission medium 4. In the prior art, a representative technology disclosed by Andrii V. Chumak et al. (Magnon Transistor for All-Magnon Data Processing, Nature Communications, 5, 4700, 2014) requires a microwave source to generate a microwave current and injects the microwave current into a generation terminal. A vector network analyzer detects a magnon on a detection terminal. A control method is based on the microwave current, and a large number of magnons are locally generated. Transmission of the magnon from the generation terminal to the detection terminal is controlled by regulating scattering between the magnons. In this technology, both the microwave source and the vector network analyzer are expensive. In addition, additional Joule heat is caused when the microwave current is applied to a control terminal to regulate the transmission of the magnon. This technology is volatile, as the regulation of magnon disappears once the microwave current is removed. In a representative technology disclosed by L. J. Cornelissen et al. (Spin-Current-Controlled Modulation of the Magnon Spin Conductance in a Three-Terminal Magnon Transistor, Physical Review Letters 120, 097702, 2018), a low-frequency alternating current is inputted into a generation terminal to generate a magnon, and a detection terminal detects magnon information through 1st and 2nd harmonic signals. A control method is based on a direct current. In this technology, a large direct current inputted into a control terminal to regulate transmission of the magnon also causes additional Joule heat. An operating temperature is 250 Kelvin, lower than a room temperature, and a switching ratio is low (1.6%/mA). This technology is also volatile. In a representative technology disclosed by K. S. Das et al. (Modulation of Magnon Spin Transport in a Magnetic Gate Transistor, Physical Review B 101, 054436, 2020), a generation terminal and a detection terminal of a magnon are similar to those in the technology disclosed by L J. Cornelissen et al. In this technology, a control terminal is made of an iron nickel alloy, and a control method is based on a magnetic field. The magnetic field is applied in a direction perpendicular to a strip direction to change a magnetic moment direction of an iron nickel alloy magnetic moment relative to a transmission medium yttrium iron garnet, thereby affecting transmission of the magnon. A switching ratio is not high (18%). This technology is also volatile. A representative technology disclosed by Guangyi Chen et al. (Electrically Switchable Van der Waals Magnon Valves, Nature Communications, 12, 6279, 2021) uses two-dimensional $MnPS_3$ as a transmission medium of a device, and a control method is based on a direct current. A large direct current is inputted into a control terminal to affect transmission of a magnon, which also causes additional Joule heat, and an extremely low temperature (2 Kelvin) is required for operation.

From this, it can be seen that control methods for existing three-terminal magnon transistors are mainly based on the microwave current, the direct current, and the magnetic field. All of these control methods can lead to additional Joule heat and have a disadvantage of a high power consumption. In addition, some of current devices need to operate at a temperature (250 Kelvin) lower than the room temperature, and even at an extremely low temperature (2 Kelvin). All of these devices are volatile.

SUMMARY

To solve the aforementioned problems, the present disclosure provides a voltage-controlled three-terminal magnon transistor, which can operate in a wide temperature range including a room temperature (approximately 300 Kelvin), has a high switching ratio, and is non-volatile. Further, the present disclosure provides a control and preparation method of the foregoing voltage-controlled three-terminal magnon transistor.

A first aspect of the present disclosure provides a voltage-controlled three-terminal magnon transistor, including: a ferroelectric layer, a magnetic layer formed on a first surface of the ferroelectric layer, a generation terminal, a control terminal and a detection terminal that are formed on the magnetic layer, and a bottom electrode formed on a second surface of the ferroelectric layer, where the second surface is arranged opposite to the first surface. The generation terminal is configured to generate a magnon in the magnetic layer based on a thermal effect after a current is inputted; the detection terminal is configured to convert the magnon in the magnetic layer into a charge flow based on a strong spin-orbit coupling effect of the detection terminal, where the detection terminal is made of a heavy metal material; the ferroelectric layer is configured to change non-volatile polarization and non-volatile strain states of the ferroelectric layer when a voltage pulse applied between the control terminal and the bottom electrode exceeds a critical value, and further affect a transmission capability of the magnon in the magnetic layer based on a magnetoelectric coupling effect between the ferroelectric layer and the magnetic layer; and a voltage signal of the detection terminal exhibits a regular loop change behavior with a change of the voltage pulse.

As an optional solution, the generation terminal is made of the heavy metal material, and is further configured to generate a spin current based on a strong spin-orbit coupling effect after the current is inputted, where the spin current is converted into the magnon after being injected into the magnetic layer.

As an optional solution, the control terminal is made of the heavy metal material.

As an optional solution, the ferroelectric layer is a ferroelectric substrate, a ferroelectric film, or a ferroelectric slice; and the ferroelectric layer is made of any one of lead magnesium niobate-lead titanate, lead zirconate titanate, barium titanate, potassium dihydrogen phosphate, lead titanate, and lead tungstate, and is preferably the lead magnesium niobate-lead titanate.

As an optional solution, the ferroelectric layer is the ferroelectric film or the ferroelectric slice with a thickness of 1 nanometer to 2 millimeters.

As an optional solution, the magnetic layer is made of a magnetic insulator material, and the magnetic insulator material includes yttrium iron garnet ferrite, iron trioxide, and chromic oxide, and is preferably the yttrium iron garnet ferrite.

As an optional solution, a thickness of the magnetic layer ranges from 1 nanometer to 100 micrometers, and is preferably 100±50 nanometers.

As an optional solution, the bottom electrode is located directly below the control terminal and wraps the control terminal, and is made of a conductive material, where the conductive material includes at least one of platinum, gold, palladium, tungsten, tantalum, silver, copper, aluminum, titanium, silicon, gallium arsenide, gallium nitride, and titanium dioxide.

A second aspect of the present disclosure provides a control method of a three-terminal magnon transistor. The control method is based on the three-terminal magnon transistor in the first aspect or any one of the optional solutions, and includes: inputting a direct current or a low-frequency alternating current into a generation terminal, applying a voltage pulse $V_g$ from $-V_{g1}$ to $V_{g1}$ between a control terminal and a bottom electrode, where when the voltage pulse $V_g$ is greater than a positive critical value $V_t$, a transmission capability of a magnon in a magnetic insulation layer is strengthened, and a voltage signal V of a detection terminal increases, and applying a voltage pulse $V_g$ from $V_{g1}$ to $-V_{g1}$ between the control terminal and the bottom electrode, where when the $V_g$ is less than a negative critical value $-V_t$, the transmission capability of the magnon is weakened, and the voltage signal V of the detection terminal decreases, such that the voltage signal of the detection terminal exhibits a regular loop change behavior with a change of the voltage pulse.

A third aspect of the present disclosure provides a preparation method.

The preparation method is used to prepare the three-terminal magnon transistor in the first aspect or in any one of the optional solutions, and includes: providing a ferroelectric substrate or making a ferroelectric film as a ferroelectric layer; growing a magnetic layer film on a first surface of the ferroelectric layer by using a film growth technology; making a sequentially side-by-side arranged generation terminal, control terminal, and detection terminal on the magnetic insulator layer film by using an ultra-violet lithography, electron beam exposure, or etching technology and a coating technology; and finally growing a bottom electrode on a second surface of the ferroelectric layer.

The present disclosure has following beneficial effects:

(1) The voltage-controlled three-terminal magnon transistor provided in the present disclosure adopts a unique structural design, and the metal material, the magnetic layer, and the ferroelectric layer contained in the device all can operate in a wide temperature range including a room temperature. Therefore, the voltage-controlled three-terminal magnon transistor achieves a wider range of applications, and no longer needs to work in a low-temperature environment or an extremely low-temperature environment.

(2) The control method of the voltage-controlled three-terminal magnon transistor in the present disclosure is voltage control. No current is generated when the voltage is applied between the magnetic layer and the ferroelectric layer, such that no additional Joule heat is generated. Therefore, the control method is more energy-efficient, and can solve a problem of an additional power consumption caused when a control method is based on a microwave current, a direct current, or an external magnetic field.

(3) The present disclosure utilizes the magnetoelectric coupling effect between the ferroelectric layer and the magnetic layer. When the applied voltage exceeds the critical value, the non-volatile polarization and non-volatile strain states of the ferroelectric layer change. Based on the magnetoelectric coupling effect, physical properties of the magnetic layer (such as magnetic anisotropy, a magnetic exchange constant, a damping coefficient, and an attenuation length) are further affected, thereby affecting the transmission capability of the magnon in the magnetic layer and ultimately affecting strength of a magnon reaching the detection terminal. Correspondingly, higher efficiency of regulation on the properties of the magnetic layer by the voltage leads to a greater change in the strength of the magnon reaching the detection terminal, thus achieving a large switching ratio. Due to a non-volatile nature of polarization and strain regulation in the ferroelectric layer, after the applied voltage is removed, the polarization and strain states are maintained, thereby achieving a non-volatile operation for the transmission capability of the magnon.

BRIEF DESCRIPTION OF THE DRAWINGS

FIG. 1A is a top view, FIG. 1B is a cross-sectional view, and reference numerals in FIGS. 1A-1B are as follows: 1: magnon generation terminal (S); 2: magnon control terminal (G); 3: magnon detection terminal (D); and 4: magnon transmission medium;

FIG. 4A is a top view, and FIG. 4B is a side view;

Figure 1A:
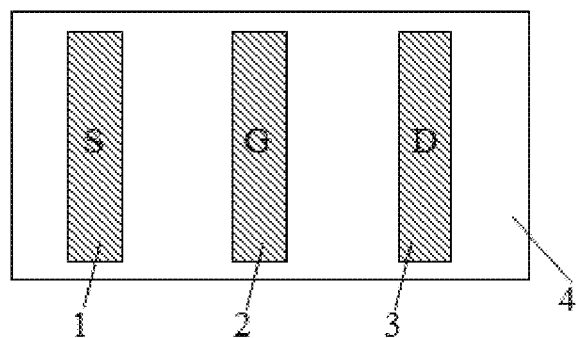
FIGS. 1A-1B are a schematic structural diagram of a three-terminal magnon transistor in the prior art, where
Figure 1B:
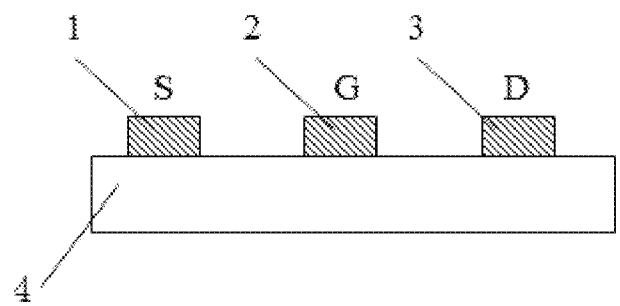

Reference numerals in FIG. 2, FIG. 3, and FIGS. 4A-4B: 1: ferroelectric layer; 2: magnetic layer; 3: generation terminal; 4: control terminal; 5: detection terminal, 6: bottom electrode; 7: current source for applying a current; 8: voltmeter for detecting a voltage signal; and 9: voltage source for applying a voltage pulse.

DETAILED DESCRIPTION OF THE EMBODIMENTS

The technical solutions of the present disclosure are described clearly and completely below with reference to specific embodiments and FIG. 2 to FIG. 6. Apparently, the described embodiments are merely a part rather than all of the embodiments of the present disclosure. All other embodiments obtained by those skilled in the art based on the embodiments of the present disclosure without creative efforts shall fall within the protection scope of the present disclosure.

Figure 2:
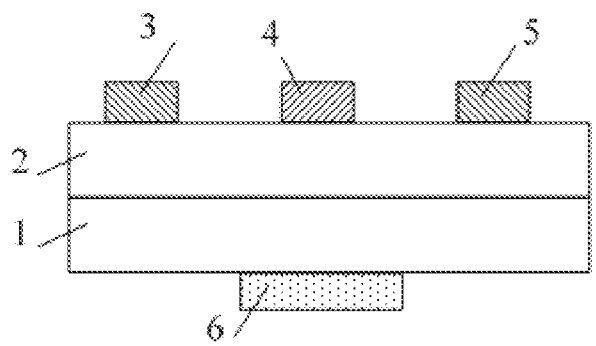
FIG. 2 is a schematic structural diagram of a three-terminal magnon transistor according to an embodiment.

As shown in FIG. 2, Embodiment 1 provides a voltage-controlled three-terminal magnon transistor, which is mainly constituted by ferroelectric layer 1, magnetic layer 2, generation terminal 3, control terminal 4, detection terminal 5, and bottom electrode 6. The ferroelectric layer 1 is a ferroelectric substrate, a ferroelectric film, or a ferroelectric slice. Polarization and strain states of the ferroelectric layer can be changed by applying a voltage, and transmission efficiency of a magnon in the magnetic insulator layer can be regulated based on a magnetoelectric coupling effect of a ferroelectric/ferromagnetic system. Materials available for the ferroelectric layer 1 include lead magnesium niobate-lead titanate ($PMN_x$-$PT_{1-x}$), lead zirconate titanate (PZT), barium titanate ($BaTiO_3$), potassium dihydrogen phosphate ($KH_2PO_4$), lead titanate ($PbTiO_3$), lead tungstate ($PbZrO_3$), and the like. The lead magnesium niobate-lead titanate is preferred, which has a wide temperature range, a strong piezoelectric effect, and a mature preparation technology. This device is not sensitive to a thickness of the ferroelectric layer 1. A millimeter-thick ferroelectric substrate may be directly purchased through commercial means, or the ferroelectric film or the ferroelectric slice with a thickness of 1 nanometer to 2 millimeters may be grown on a suitable substrate (such as a silicon slice). Compared with the ferroelectric substrate, the ferroelectric film requires only a smaller voltage to be applied to achieve same electric field strength.

The magnetic layer 2 is a magnon transmission medium. The magnon transmission medium can be obtained by growing a magnetic film on the ferroelectric layer 1 by using a film growth device. Specifically, a magnetic material with a magnetic ordering temperature higher than a room temperature, a small damping coefficient, and a long magnon transmission distance can be selected to prepare the magnetic film. Considering that a damping factor of a magnetic insulator is generally less than that of magnetic metal, and a transmission distance of the magnon is also generally greater than that of the magnetic metal, a magnetic insulator material is preferably selected to prepare the magnetic layer 2, such as yttrium iron garnet ferrite ($Y_3Fe_5O_{12}$, abbreviated as YIG), iron trioxide ($Fe_2O_3$), or chromic oxide ($Cr_2O_3$). The YIG is a preferred material among the magnetic insulators, which has advantages such as a mature preparation technology, a wide temperature range, a very small damping factor, and a long magnon transmission distance. A thickness of a magnetic insulator layer film usually ranges from 1 nanometer to 100 micrometers, and is preferably 100±50 nanometers. Within this range, properties of the magnetic film are close to those of a bulk material, with a small damping coefficient, a long magnon transmission distance, and a less attenuation of the magnetoelectric coupling effect.

The generation terminal 3, the control terminal 4, and the detection terminal 5 are all micro strips formed on a surface of the magnetic layer 2. The generation terminal 3 and the control terminal 4 are made of a conductive material such as a metallic conductive material like platinum, gold, palladium, tungsten, tantalum, silver, copper, aluminum, titanium, or titanium dioxide, or a non-metallic conductive material like silicon, gallium arsenide, or gallium nitride. After a current is inputted into the generation terminal 3, the magnon is generated in the magnetic layer 2 based on a thermal effect (for example, a spin Seebeck effect). The detection terminal 5 is made of a heavy metal material such as platinum, gold, palladium, tungsten, or tantalum, and is configured to detect the magnon. Preferably, the generation terminal 3 is made of heavy metal. In this way, the magnon can be generated in the magnetic layer 2 based on the thermal effect caused by heating, and a spin current can be generated based on a strong spin-orbit coupling effect of the generation terminal 3 and is converted into the magnon in the magnetic layer 2. Further, for simplicity of process implementation, the generation terminal 3, the control terminal 4, and the detection terminal 5 may be made of a same heavy metal material, such that exposure and coating need to be performed only once. A size and a spacing of the three micro strips can be designed conventionally, for example, with a strip length of 10 microns, a width of 0.5 microns, and a strip spacing of 0.5 microns. In a practical application, the size and the spacing of the micro strips can be further reduced as needed, without a need to follow a same proportion as the above example.

The bottom electrode 6 is formed on a surface of the ferroelectric layer 1 opposite to the magnetic layer 2. As an electrode for applying the voltage, the bottom electrode 6 is made of the conductive material such as conductive metal like platinum, gold, palladium, tungsten, tantalum, silver, copper, aluminum, or titanium, or a semiconductor material like silicon, gallium arsenide, gallium nitride, or titanium dioxide. The bottom electrode 6 is preferably located directly below the control terminal 4, and its size is similar to a size of the control terminal 4. Preferably, the bottom electrode 6 is arranged directly corresponding to the control terminal 4 and can cover the control terminal 4.

Figure 4A:
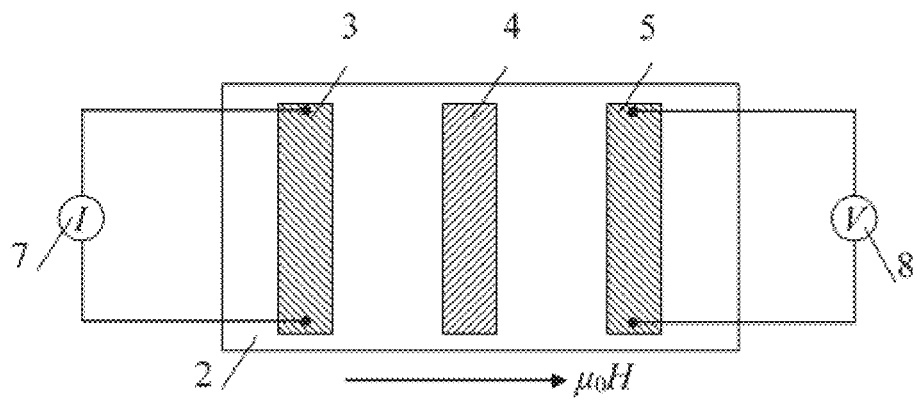
FIGS. 4A-4B are a schematic diagram of working of a three-terminal magnon transistor according to an embodiment, where

A working principle of the three-terminal magnon transistor described in Embodiment 1 is as follows: As shown in FIG. 4A, direct current (or low-frequency alternating current) I is inputted into the generation terminal 3 by using current source 7. The generation terminal 3 is made of the conductive material, and can inject the spin current into the magnetic layer 2 through two ways: 1) The current in the generation terminal 3 heats the magnetic layer 2, a temperature gradient is established, and the magnon is generated in the magnetic layer based on the thermal effect. A polarization direction of the magnon can be adjusted by in-plane magnetic field $\mu_0 H$. 2) If the generation terminal 3 is made of the heavy metal material, its strong spin-orbit coupling effect can also be used to enable a charge flow to directly generate the spin current, and the spin current is converted into the magnon in the magnetic layer 2. The polarization direction of the magnon is controlled by a direction of the charge flow in the generation terminal 3. The magnon is transmitted towards the right in the magnetic layer 2 and reaches the detection terminal 5. The detection terminal 5 made of the heavy metal material utilizes its strong spin-orbit coupling effect to convert the magnon into the charge flow, and voltage signal V of the detection terminal 5 can be obtained by using voltmeter 8 (or a lock-in amplifier).

Figure 4B:
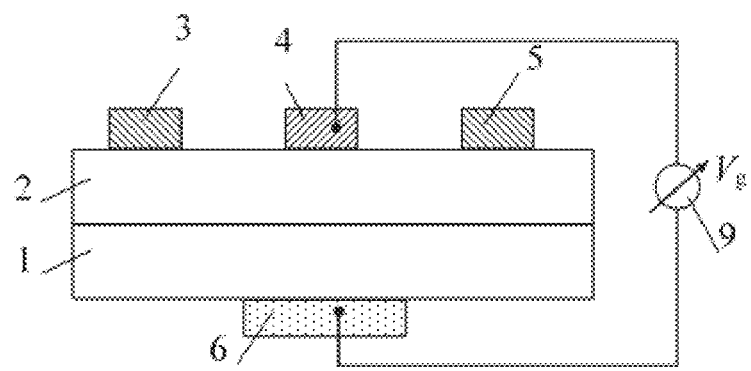

As shown in FIG. 4B, based on the three-terminal magnon transistor shown in FIG. 4A, when electric field strength generated by the applied voltage in the ferroelectric layer exceeds a critical value, non-volatile polarization and non-volatile strain states of the ferroelectric layer change. The critical electric field strength is an intrinsic property of a ferroelectric material, and its numerical value mainly depends on a selected material. An electric field is equal to the voltage divided by a distance between the control terminal 4 and the bottom electrode 6. Therefore, a critical value of the voltage is also related to thicknesses of the ferroelectric layer and a magnetic transmission layer. For a same device, due to a fixed material and thickness, voltage strength is linearly related to the voltage. That is, voltage pulse $V_g$ is applied between the control terminal 4 and the bottom electrode 6. When the $V_g$ exceeds a critical voltage (in other words, an absolute value is greater than an absolute value of the critical voltage), the polarization and strain states of ferroelectric layer 1 change, and then a magneto-electric coupling effect between the ferroelectric layer 1 and the magnetic layer 2 affects a transmission capability of the magnon in the magnetic layer 2. Due to a non-volatile nature of polarization and strain changes in the ferroelectric layer 1, the polarization and strain states of the ferroelectric layer 1 are maintained even after the applied voltage pulse is removed, thereby achieving non-volatile regulation for the transmission capability of the magnon in the magnetic layer 2.

Figure 5:
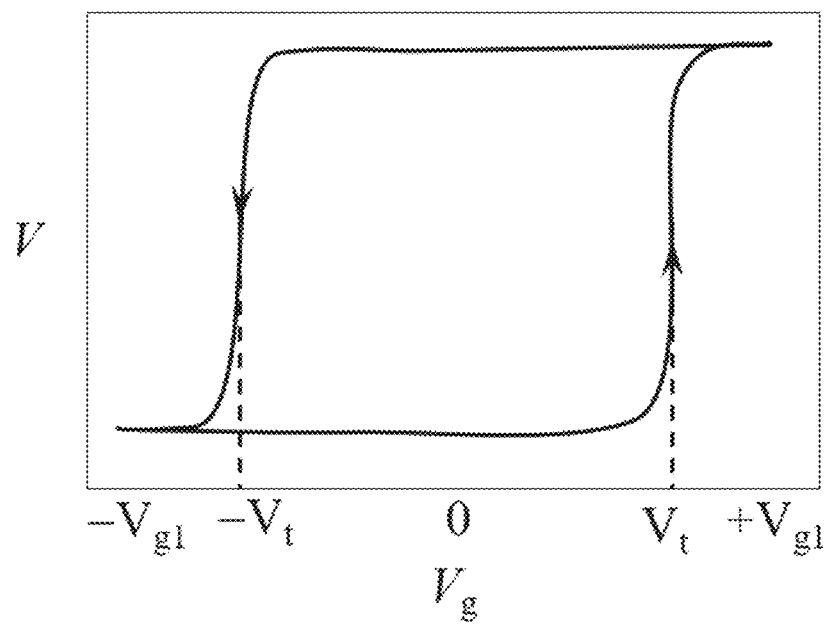
FIG. 5 is a schematic diagram of a curve indicating that a voltage signal detected by a three-terminal magnon transistor changes with a voltage pulse according to an embodiment.

Specifically, a voltage pulse from $-V_{g1}$ to $V_{g1}$ is applied between the control terminal 4 and the bottom electrode 6. A width of the voltage pulse can be selected from 1 nanosecond to 10 seconds, and a pulse waveform is not limited and may be stepped, diagonal, stair-stepped, or the like. When the voltage is greater than positive critical value $V_f$, polarization and strain in the ferroelectric layer 1 change, and the transmission capability of the magnon in the magnetic layer 2 increases based on the magnetoelectric coupling effect. In an experiment, it is observed that the voltage signal V of the detection terminal 5 increases. A voltage pulse from $V_{g1}$ to $-V_{g1}$ is applied. When the voltage is less than negative critical value $-V_f$, the polarization and the strain in the ferroelectric layer 1 change, and the transmission capability of the magnon in the magnetic layer 2 decreases based on the magnetoelectric coupling effect. In the experiment, it is observed that the voltage signal V of the detection terminal 5 decreases. In summary, the voltage signal V of the detection terminal 5 exhibits a regular loop change behavior with a change of the voltage pulse $V_g$, in other words, there is a dependence relationship between the V and $V_g$, as shown in FIG. 5.

Figure 6:
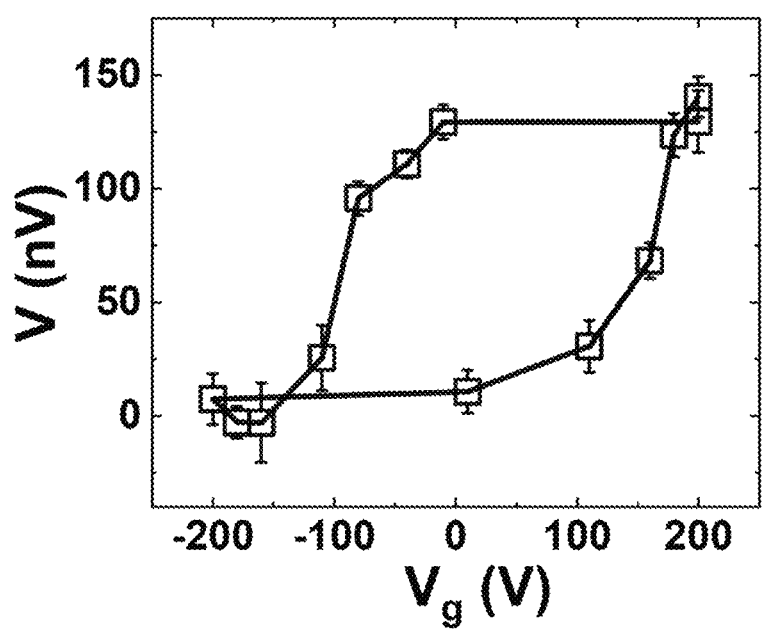
FIG. 6 shows experimental data of a curve indicating that a voltage signal detected by a three-terminal magnon transistor changes with a voltage pulse according to an embodiment.

As shown in FIG. 6, in an embodiment, different voltage pulses ranging from −200 V to 200 V and then to −200 V can be applied to the lead magnesium niobate-lead titanate (ferroelectric layer 1) with a thickness of 0.5 millimeters and the yttrium iron garnet ferrite (magnetic layer 2) with a thickness of 100 nanometers. The width of the voltage pulse is 10 seconds, and the pulse waveform is diagonal. An actually measured voltage signal of the detection terminal 5 is obtained. It can be seen that the voltage signal V measured for the detection terminal 5 undergoes a significant change at 150 V and −100 V, corresponding to changes in the polarization and strain states of the lead magnesium niobate-lead titanate, thereby affecting the transmission capability of the magnon in the yttrium iron garnet ferrite.

Figure 3:
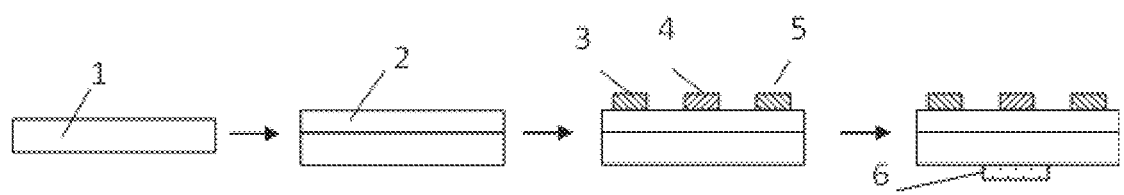
FIG. 3 is a schematic flowchart of preparing a three-terminal magnon transistor according to an embodiment.

As shown in FIG. 3, Embodiment 2 provides a preparation method of a device. The preparation method is used to prepare the three-terminal magnon transistor described in Embodiment 1. The preparation method mainly includes following steps.

Step 1: A commercially purchased single crystal substrate made of lead magnesium niobate-lead titanate and with a thickness of 0.5 millimeters is used as a carrier of the device, and thus ferroelectric layer 1 is obtained.

Step 2. A magnetic layer film is grown on a front face of the ferroelectric layer 1 by using a film growth technology, for example, yttrium iron garnet ferrite with a thickness of 100 nanometers is grown.

Step 3: Three nanometer-thick metal strips are made on the magnetic layer film by using an ultra-violet lithography, electron beam exposure, or etching technology and a coating technology, for example, platinum with a length of 10 microns, a width of 0.5 microns, a strip spacing of 0.5 microns, and a thickness of 5 nanometers.

Step 4: On a back face of the ferroelectric layer 1, bottom electrode 6 is grown at a position facing control terminal 4. For example, gold with a thickness of 100 nanometers is used as the bottom electrode 6. Up to now, a target three-terminal magnon transistor is formed.

Finally, it should be noted that although embodiments of the present disclosure have been presented and described as much as possible, those skilled in the art can still make modifications and improvements to the present disclosure based on the aforementioned embodiments, which should be included in the protection scope of the present disclosure.

What is claimed is:

1. A voltage-controlled three-terminal magnon transistor, comprising:
   a ferroelectric layer;
   a magnetic layer formed on a first surface of the ferroelectric layer;
   a generation terminal, a control terminal, and a detection terminal, wherein the generation terminal, the control terminal, and the detection terminal are formed on the magnetic layer, and the detection terminal is made of a heavy metal material; and
   a bottom electrode formed on a second surface of the ferroelectric layer, wherein the second surface is arranged opposite to the first surface;
   wherein the generation terminal is further configured to generate a magnon in the magnetic layer based on a thermal effect after a current is inputted;
   the detection terminal is further configured to convert the magnon in the magnetic layer into a charge flow based on a strong spin-orbit coupling effect of the detection terminal;
   the ferroelectric layer is further configured to change non-volatile polarization and non-volatile strain states of the ferroelectric layer when a voltage pulse applied between the control terminal and the bottom electrode exceeds a critical value, and further affect a transmission capability of the magnon in the magnetic layer based on a magnetoelectric coupling effect between the ferroelectric layer and the magnetic layer; and the detection terminal is further configured to enable a detected voltage signal to exhibit a regular loop change behavior with a change of the voltage pulse.

2. The voltage-controlled three-terminal magnon transistor according to claim 1, wherein the generation terminal is made of the heavy metal material.

3. The voltage-controlled three-terminal magnon transistor according to claim 2, wherein the heavy metal material is one of platinum, gold, palladium, tungsten, and tantalum.

4. The voltage-controlled three-terminal magnon transistor according to claim 2, wherein the generation terminal is further configured to generate a spin current based on a strong spin-orbit coupling effect after a current is inputted; and the spin current is converted into a magnon after being injected into the magnetic layer.

5. The voltage-controlled three-terminal magnon transistor according to claim 2, wherein the control terminal is made of the heavy metal material.

6. The voltage-controlled three-terminal magnon transistor according to claim 1, wherein the ferroelectric layer is a ferroelectric substrate, a ferroelectric film, or a ferroelectric slice; and the ferroelectric layer is made of any one of lead magnesium niobate-lead titanate, lead zirconate titanate, barium titanate, potassium dihydrogen phosphate, lead titanate, and lead tungstate.

7. The voltage-controlled three-terminal magnon transistor according to claim 6, wherein the ferroelectric layer is the ferroelectric film or the ferroelectric slice with a thickness of 1 nanometer to 2 millimeters.

8. The voltage-controlled three-terminal magnon transistor according to claim 6, wherein the ferroelectric layer is made of the lead magnesium niobate-lead titanate.

9. The voltage-controlled three-terminal magnon transistor according to claim 1, wherein the magnetic layer is made of a magnetic insulator material, and the magnetic insulator material comprises yttrium iron garnet ferrite, iron trioxide, and chromic oxide.

10. The voltage-controlled three-terminal magnon transistor according to claim 9, wherein the magnetic layer is made of the yttrium iron garnet ferrite.

11. The voltage-controlled three-terminal magnon transistor according to claim 9, wherein a thickness of the magnetic layer ranges from 1 nanometer to 100 micrometers, and is preferably 100±50 nanometers.

12. The voltage-controlled three-terminal magnon transistor according to claim 9, wherein a thickness of the magnetic layer is 100±50 nanometers.

13. The voltage-controlled three-terminal magnon transistor according to claim 1, wherein the bottom electrode is located directly below the control terminal and wraps the control terminal, and the bottom electrode is made of a conductive material.

14. The voltage-controlled three-terminal magnon transistor according to claim 13, wherein the conductive material comprises at least one of platinum, gold, palladium, tungsten, tantalum, silver, copper, aluminum, titanium, silicon, gallium arsenide, gallium nitride, and titanium dioxide.

15. A control method of a three-terminal magnon transistor, wherein the control method is based on a voltage-controlled three-terminal magnon transistor, the voltage-controlled three-terminal magnon transistor comprises:

a ferroelectric layer;

a magnetic layer formed on a first surface of the ferroelectric layer;

a generation terminal, a control terminal, and a detection terminal, wherein the generation terminal, the control terminal, and the detection terminal are formed on the magnetic layer, and the detection terminal is made of a heavy metal material; and a bottom electrode formed on a second surface of the ferroelectric layer, wherein the second surface is arranged opposite to the first surface;

the control method comprises: inputting a direct current or a low-frequency alternating current into the generation terminal; and applying a voltage pulse $V_g$ from $-V_{g1}$ to $V_{g1}$ between the control terminal and the bottom electrode, wherein when the voltage pulse $V_g$ is greater than a positive critical value $V_r$, a transmission capability of a magnon in a magnetic insulation layer is strengthened, and a voltage signal V of the detection terminal increases; and applying a voltage pulse $V_g$ from the $V_{g1}$ to the $-V_{g1}$ between the control terminal and the bottom electrode, wherein when the voltage pulse $V_g$ is less than a negative critical value $-V_r$, the transmission capability of the magnon is weakened, and the voltage signal V of the detection terminal decreases, such that the voltage signal of the detection terminal exhibits a regular loop change behavior with a change of the voltage pulse.

16. A preparation method, wherein the preparation method is used to prepare the voltage-controlled three-terminal magnon transistor according to claim 1, and comprises:

providing a ferroelectric substrate or making a ferroelectric film as the ferroelectric layer;

growing a magnetic layer film on the first surface of the ferroelectric layer by using a film growth technology;

making a sequentially side-by-side arranged generation terminal, control terminal, and detection terminal on the magnetic insulator layer film by using an ultraviolet lithography, electron beam exposure, or etching technology and a coating technology; and finally growing the bottom electrode on the second surface of the ferroelectric layer.

17. The voltage-controlled three-terminal magnon transistor according to claim 2, wherein the ferroelectric layer is a ferroelectric substrate, a ferroelectric film, or a ferroelectric slice; and the ferroelectric layer is made of any one of lead magnesium niobate-lead titanate, lead zirconate titanate, barium titanate, potassium dihydrogen phosphate, lead titanate, and lead tungstate.

18. The voltage-controlled three-terminal magnon transistor according to claim 3, wherein the ferroelectric layer is a ferroelectric substrate, a ferroelectric film, or a ferroelectric slice; and the ferroelectric layer is made of any one of lead magnesium niobate-lead titanate, lead zirconate titanate, barium titanate, potassium dihydrogen phosphate, lead titanate, and lead tungstate.

19. The voltage-controlled three-terminal magnon transistor according to claim 4, wherein the ferroelectric layer is a ferroelectric substrate, a ferroelectric film, or a ferroelectric slice; and the ferroelectric layer is made of any one of lead magnesium niobate-lead titanate, lead zirconate titanate, barium titanate, potassium dihydrogen phosphate, lead titanate, and lead tungstate.

20. The voltage-controlled three-terminal magnon transistor according to claim 5, wherein the ferroelectric layer is a ferroelectric substrate, a ferroelectric film, or a ferroelectric slice; and the ferroelectric layer is made of any one of lead magnesium niobate-lead titanate, lead zirconate titanate, barium titanate, potassium dihydrogen phosphate, lead titanate, and lead tungstate.

\* \* \* \* \*